United States Patent
Shin et al.

(10) Patent No.: US 10,067,259 B2
(45) Date of Patent: Sep. 4, 2018

(54) DOWNHOLE DETECTOR WITH REDUCED RINGING

(71) Applicant: HALLIBURTON ENERGY SERVICES, INC., Houston, TX (US)

(72) Inventors: Chang S. Shin, Kingwood, TX (US); David Ronald Beard, Houston, TX (US); Arcady Reiderman, Katy, TX (US); William D. Johnson, Cypress, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 12 days.

(21) Appl. No.: 15/127,126

(22) PCT Filed: Dec. 17, 2015

(86) PCT No.: PCT/US2015/066476
§ 371 (c)(1),
(2) Date: Sep. 19, 2016

(87) PCT Pub. No.: WO2017/105468
PCT Pub. Date: Jun. 22, 2017

(65) Prior Publication Data
US 2018/0017698 A1    Jan. 18, 2018

(51) Int. Cl.
*G01V 3/32* (2006.01)
*G01R 33/36* (2006.01)

(52) U.S. Cl.
CPC .............. *G01V 3/32* (2013.01); *G01R 33/36* (2013.01)

(58) Field of Classification Search
CPC ...... G01V 3/32; G01R 33/36; G01R 19/0038; G01R 19/0053; G01R 19/16585; G01R 29/02; G01R 23/09; G01R 31/016; G01R 31/028; G01N 24/00; G01N 24/08
See application file for complete search history.

(56) References Cited

U.S. PATENT DOCUMENTS

| | | |
|---|---|---|
| 5,783,898 A | 7/1998 | Wu |
| 6,291,994 B1 | 9/2001 | Kim et al. |
| 6,361,643 B2 | 3/2002 | Born et al. |
| 6,690,170 B2 | 2/2004 | Homan et al. |
| 7,916,092 B2 | 3/2011 | Homan et al. |
| 2002/0036503 A1* | 3/2002 | Toufaily ............... G01N 24/081 324/318 |
| 2009/0082673 A1* | 3/2009 | Lu ........................ A61B 8/4281 600/459 |

(Continued)

FOREIGN PATENT DOCUMENTS

EP    0819257 B1    7/2005

OTHER PUBLICATIONS

International Search Report and Written Opinion; PCT Application No. PCT/US2015/066476; dated Sep. 7, 2016.

*Primary Examiner* — Son Le
(74) *Attorney, Agent, or Firm* — Polsinelli PC

(57) ABSTRACT

A nuclear magnetic resonance logging tool is provided. The tool includes a flexible or semi-flexible circuit board, at least one capacitor mounted on board, and a controller programmed to apply sequential pulses to the at least one capacitor of the tool with a spacing of less than 600 μs between adjacent pulses. Ring down time induced by the at least one capacitor in response to pulses is less than about 200 μs.

25 Claims, 12 Drawing Sheets

(56) References Cited

U.S. PATENT DOCUMENTS

| | | |
|---|---|---|
| 2009/0096447 A1 | 4/2009 | Prance et al. |
| 2013/0162249 A1 | 6/2013 | Dietz et al. |
| 2015/0070864 A1 | 3/2015 | Rainer et al. |
| 2015/0260813 A1 | 9/2015 | Mandal et al. |
| 2016/0056091 A1* | 2/2016 | Kim .................. H01L 23/552 257/368 |
| 2017/0064811 A1* | 3/2017 | Li ........................ H01G 4/224 |
| 2017/0248732 A1* | 8/2017 | Song ...................... G01V 3/32 |

* cited by examiner

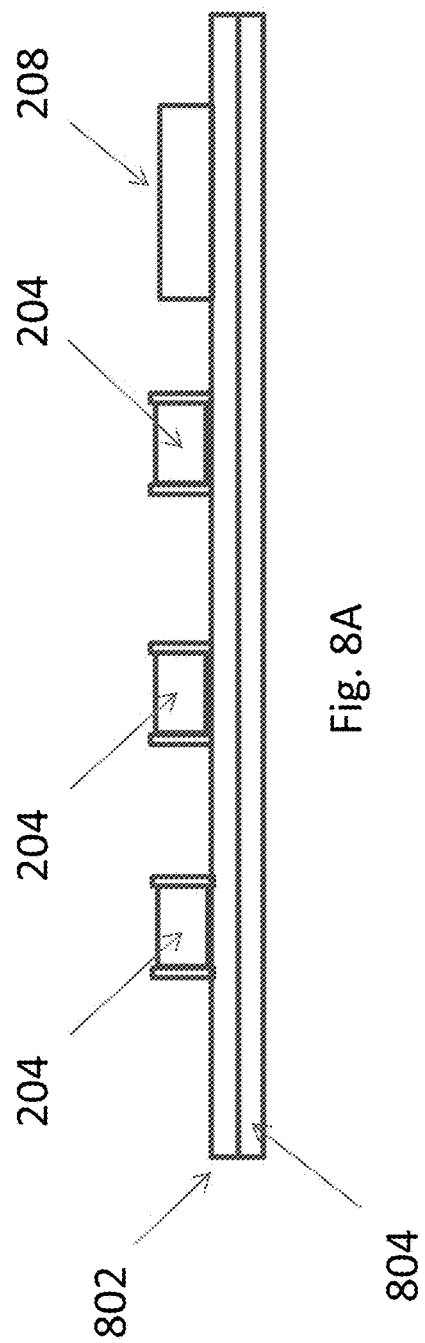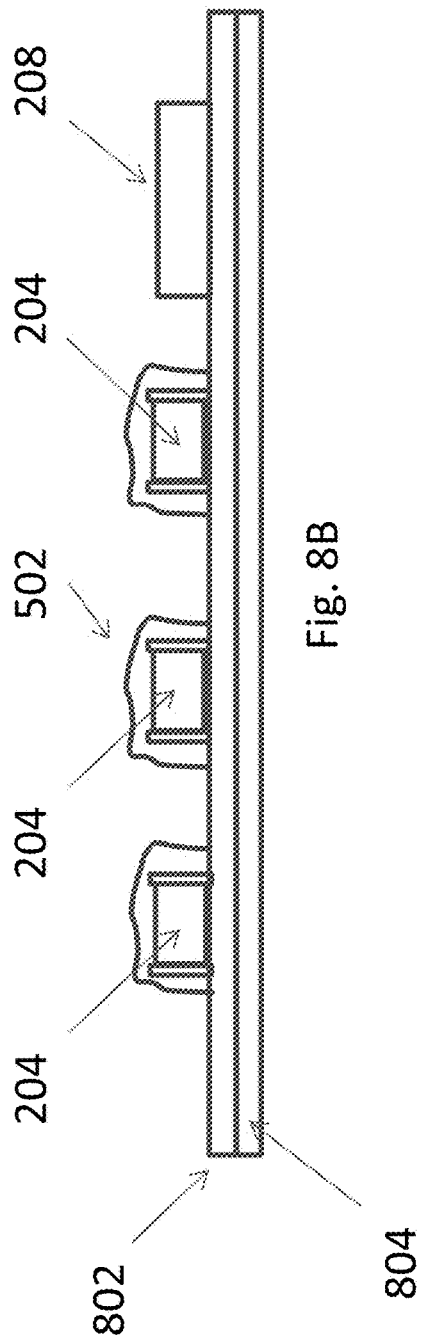

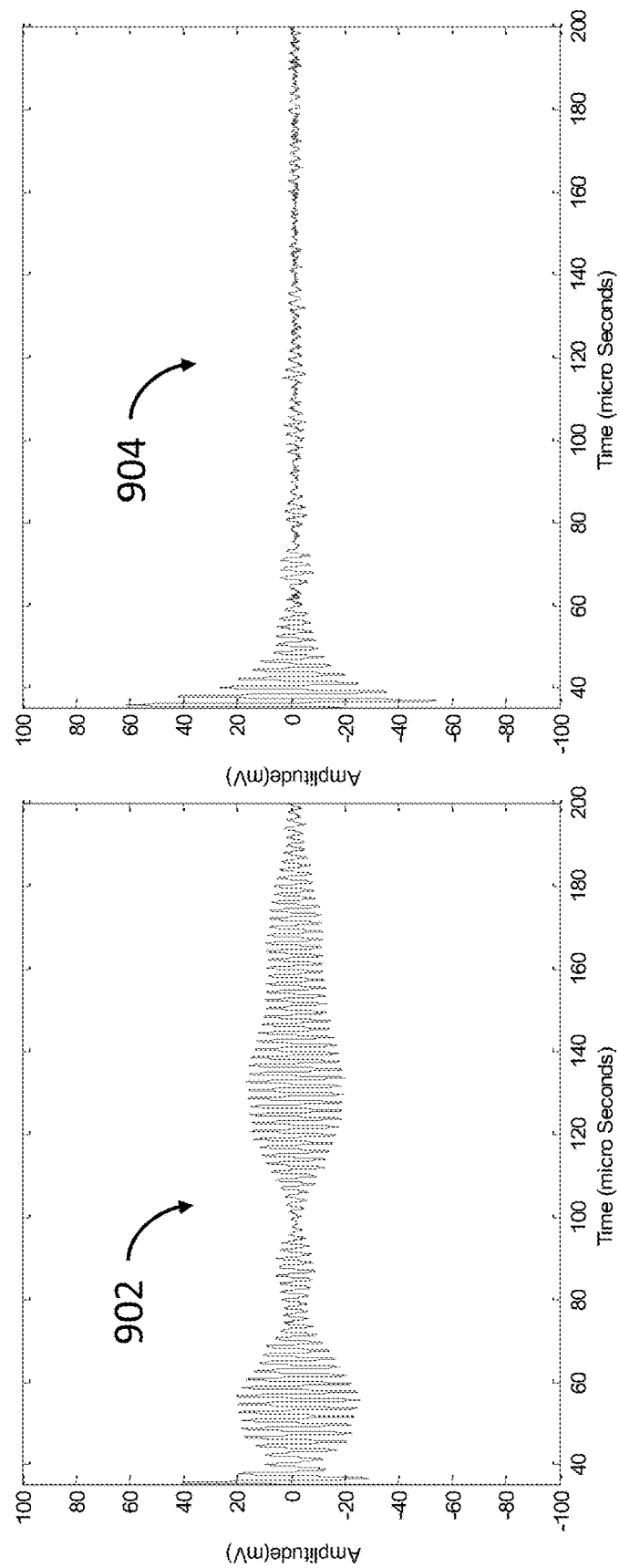

DOWNHOLE DETECTOR WITH REDUCED RINGING

CROSS-REFERENCE TO RELATED APPLICATIONS

This application is a nation stage entry of PCT/US2015/066476 filed Dec. 17, 2015, said application is expressly incorporated herein in its entirety.

FIELD

The various embodiments described herein relate generally to a magnetic resonance logging tool. More specifically, the present disclosure relates to the architecture of the underlying circuit components to reduce mechanical vibration, which induces undesirable electrical ringing signal in the magnetic resonance measurement.

BACKGROUND

Oil field operators demand access to a great quantity of information regarding the parameters and conditions encountered downhole. Such information includes characteristics of the earth formations traversed by the borehole and/or data relating to the size and configuration of the borehole itself. The measured parameters are usually recorded and displayed in the form of a log, i.e., a graph showing the measured parameter as a function of tool position or depth. The collection of information relating to conditions downhole is commonly referred to as "logging".

Many types of downhole tools exist. One available type of downhole tool is a nuclear magnetic resonance (NMR) logging tool. NMR tools operate by using an imposed static magnetic field, B0, to preferentially align certain nuclei (e.g. Hydrogen) and thereby produce a bulk magnetization. A second magnetic field, which varies in time, is also applied. This field is typically designated as B1 and is traditionally called the "radio frequency (RF) pulse". After a change in the bulk magnetization due to the radio frequency pulse, the nuclei converge upon their equilibrium alignment with a characteristic exponential relaxation time constant known as the "spin-lattice" or "longitudinal" relaxation time T1. Another relaxation time constant that can be measured is the "spin-spin" or "transverse" relaxation time T2. The tool applies an RF electromagnetic pulse whose magnetic component, B1, is perpendicular to the static field B0. This pulse tips the nuclei's magnetic orientation into the transverse (perpendicular) plane and, once the pulse ends, causes them to precess ("spin") in the transverse plane as they realign themselves with the static field. The T2 relaxation time constant represents how quickly the transverse plane magnetization disperses through de-phasing and magnitude loss. The precessing nuclei generate a detectable radio frequency signal that can be used to measure statistical distributions of T1 and T2, from which other formation properties such as porosity, permeability, and hydrocarbon saturation can be determined. To enhance the measurement accuracy of the relaxation times, the tool can provide a sequence of radio frequency pulses (such as the well-known Carr-Purcell-Meiboom-Gill "CPMG" pulse sequence) to invert the spin phase and cause the dispersed transverse plane magnetization to gradually refocus into phase, thereby inducing a series of "spin echo" signals.

Measuring relaxation times in these applications requires application of high voltage RF pulses applied to the NMR tool. For instance, a CPMG pulse sequence consists of one excitation pulse and a train of pulses that are separated by predetermined time, called inter-echo time (TE). The applied RF excitation voltages across antenna terminals within the NMR logging tool are often of the order of kV (e.g., 1000-2000 volts). The NMR logging tool is listening for the responsive spin echo that appears between the pulses is of the order of hundreds of nano-Volts. Extremely high amounts of excitation voltage are thus needed to detect relatively insignificant amount of echo response. Smaller inter-echo time (TE) allows for more applied pulses, and the NMR tool can record the spin echo signal as often as possible before the spins are relaxed back to thermal equilibrium.

A limiting factor on the inter-echo time (TE) is known as "ringing", which capacitors, typically ceramic capacitors, inside the logging tool physically vibrate in response to the applied RF pulses. "Ring-down time" refers to the amount of time it takes to damp ringing from electrical and mechanical energies down to the level of spin echo signal after an RF pulse. The time between pulse and echo must be longer than the ring down time to allow the ringing to dissipate before meaningful echo detection.

BRIEF DESCRIPTION OF THE DRAWINGS

Various embodiments in accordance with the present disclosure will be described with reference to the drawings, in which.

FIGS. 8A and 8B illustrate an internal circuit of an NMR tool according to other embodiments of the present disclosure.

FIGS. 9A and 9B illustrate a graph of the ringing produced by the embodiment of FIGS. 8A and 8B, respectively.

DETAILED DESCRIPTION

Figure 1:
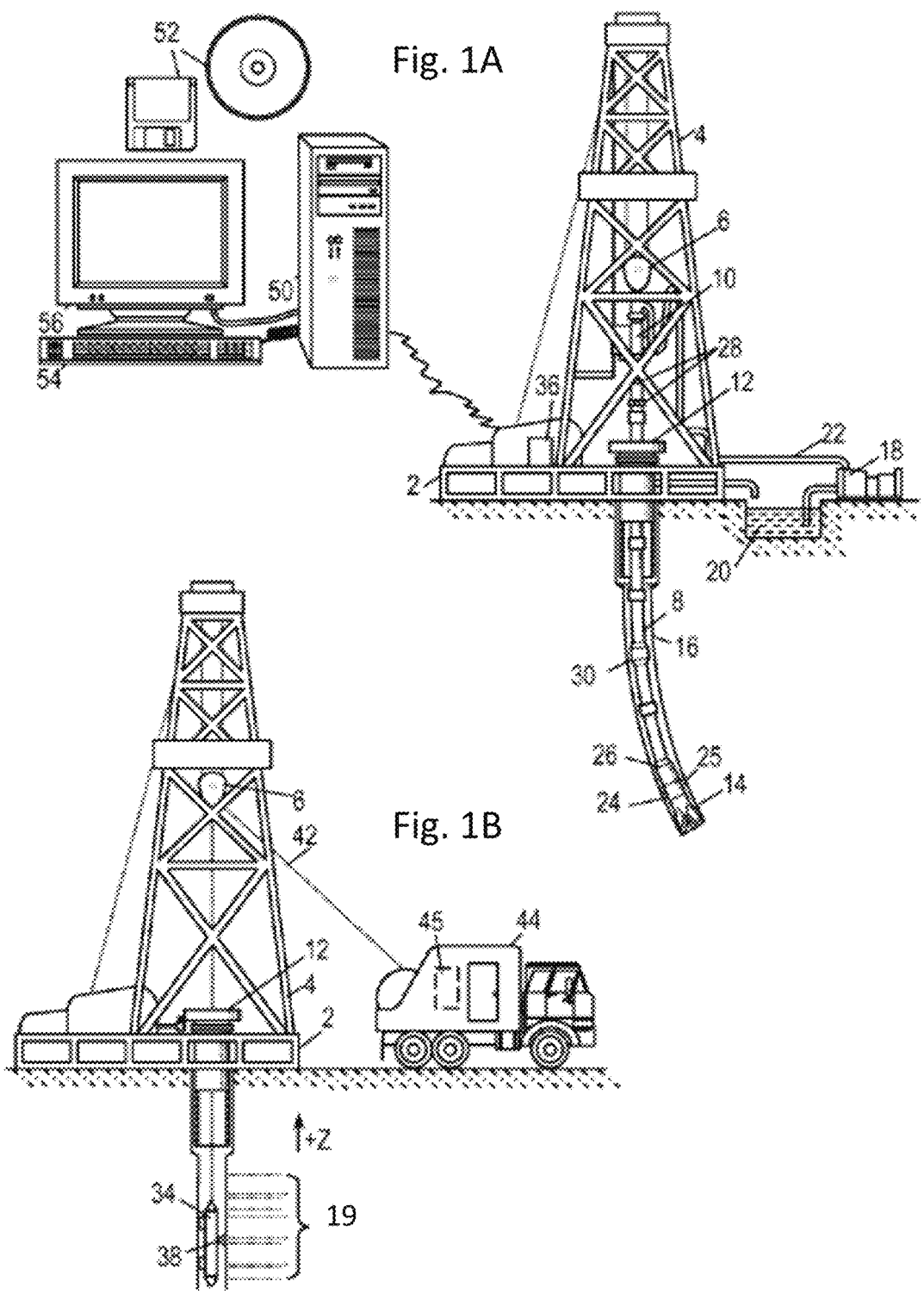
FIGS. 1A and 1B illustrate a system for use of an NMR tool according to an embodiment of the disclosure.

In the following description, various embodiments will be illustrated by way of example and not by way of limitation in the figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Several definitions that apply throughout the disclosure will now be presented. The term "coupled" is defined as connected, whether directly or indirectly through intervening components, and is not necessarily limited to physical connections. The connection can be such that the objects are permanently connected or releasably connected. The terms "comprising," "including" and "having" are used interchangeably in this disclosure. The terms "comprising," "including" and "having" mean to include, but not necessarily be limited to the things so described. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" in connection with a numerical value indicates that numerical value within a range of measurement of the measuring equipment.

The term "rugged" or "ruggedized" as used herein means a material, tool or device or other component that can withstand and regularly operate in conditions existing in a wellbore, such as temperatures in excess of 85 degrees Celsius, or in excess of 125 degrees Celsius, and at least able to withstand temperatures between 100-200 degrees Celsius, and/or pressures in excess of atmospheric pressure, and at least able to withstand pressures between 20-40 kpsi. Accordingly the temperature and pressure conditions in a wellbore as deep as 5 km, 10 km, 15 km or 20 km downhole can be withstood. Temperature resistant coatings and materials can be provided with any of the ruggedized downhole components to protect them in the downhole environment.

The term "semi-flexible" as it relates to circuit boards embodies the term as understood in the art, and generally describes circuit boards with a flexibility that lies between the rigid nature of the classic circuit board (for which virtually any bend will damage the board) to the near total flexibility of a flexible printed circuit board (which can assume almost any shape when bent and hold that shape). Unlike a rigid printed circuit board, the semi-flexible circuit board can be bent. Unlike a flexible printed circuit board, the semi-flexible circuit board has a limited bending radius.

The exemplary embodiments disclose herein provide a logging tool with integrated components that substantially damp ringing. The circuit boards within the logging tool that bear the capacitors are semi-flexible printed circuit boards. Capacitors mounted on the circuit boards are coated in acoustic damping material, such as by way of non-limiting example RTV silicon. The damping material and flexibility of the circuit board significantly attenuate ringing, thereby substantially reducing the ring down time. This allows a corresponding reduction in inter-echo time (TE), application of a greater number of pulses and corresponding greater collection of spin echo signals.

According to an embodiment, a nuclear magnetic resonance logging tool is provided. The tool includes a flexible or semi-flexible circuit board, at least one capacitor mounted on board, and a controller programmed to apply sequential pulses to the at least one capacitor of the NMR tool with a spacing of less than 600 µs between adjacent pulses. Ring down time induced by the capacitors in response to pulses is less than about 200 µs.

The above embodiment may have various features. The at least one capacitor may be ceramic. An acoustic damping material may substantially coating an exposed surface of the capacitors, and may be a room temperature vulcanization (RTV) silicon, may have an acoustic impedance within 0.3 to 3 times that of the at least one capacitor, and may be a material that can be spread on the at least one capacitor. The controller may configured to apply sequential pulses to the capacitors of the NMR tool with a spacing of less than 300 µs between adjacent pulses, or less than 200 µs between adjacent pulses. The board may be a semi-flexible circuit board that has a limited bending radius of no less than about 10× the thickness of the board.

According to another embodiment of the present disclosure, a system is provided. The system includes nuclear magnetic resonance (NMR) device disposed in a wellbore. The system includes a flexible or a semi-flexible circuit board, at least one capacitor mounted on the board, and a controller programmed to apply sequential pulses to the capacitors to the at least one capacitor with a spacing of less than 200 µs between adjacent pulses. A ring down time induced by the at least one capacitor in response to pulses is less than about 50 µs.

The above embodiment may have various features. The controller may be programmed to apply sequential pulses to the at least one capacitors with a spacing of less than 300 µs between adjacent pulses. The acoustic damping material can be room temperature vulcanization (RTV) silicon. The acoustic damping material can have an acoustic impedance within 0.3-3 times that of the capacitors. The acoustic damping material can be a material that can be spread on the at least one capacitor. The ring down time induced by the at least one capacitor can be less than about 50 µs or about 40 µs. The semi-flexible circuit board can have a limited bending radius of no less than about 10× the thickness of the semi-flexible circuit board. The NMR device may be suspended by a wireline in the borehole or incorporated into a drill string.

According to another embodiment of the invention, a testing method, is provided. The testing method includes: providing a nuclear magnetic resonance (NMR) device, the device include a semi-flexible circuit board, at least one ceramic capacitor mounted on the semi-flexible circuit board, and a controller; deploying the NMR device down a borehole to a sensing zone; collecting NMR measurements from the sensing zone; the collecting comprising applying by the controller sequential pulses to the at least one ceramic capacitor of the NMR device with a spacing of less than 600 µs between adjacent pulses; wherein ring down time induced by the at least capacitor in response to the applying is less than about 200 µs.

The above embodiment may have various features. The controller may be programmed to apply sequential pulses to the at least one ceramic capacitor with a spacing of less than 300 µs between adjacent pulses. An acoustic damping material may be substantially coating an exposed surface of the at least one ceramic capacitor.

The disclosed systems and methods are best understood in the context of an environment in which they operate. Accordingly, FIG. 1A shows an illustrative logging while drilling (LWD) environment. A drilling platform 2 supports a derrick 4 having a traveling block 6 for raising and lowering a drill string 8. A top drive 10 supports and rotates the drill string 8 as the string is lowered through a well head 12. The drill string's rotation (and/or a downhole motor) drives a drill bit 14 to extend the borehole 16. Mud recirculation equipment 18 draws drilling fluid from a retention pit 20 and pumps it through a feed pipe 22 to top drive 10, through the interior of drill string 8 to the drill bit 14, through orifices in drill bit, through the annulus around drill string 8 to a blowout preventer at the surface, and through a discharge pipe into the pit 20. The drilling fluid transports cuttings from the borehole into the pit 20 and aids in maintaining the borehole integrity.

An NMR tool 24 is integrated into the bottom-hole assembly ("BHA") near the bit 14. As the bit extends the borehole through the formations, the NMR tool 24 collects measurements relating to spin relaxation time distributions as a function of depth or position in the borehole. A probe with an extendible isolation pad or inflatable packer(s) 25 can be included to isolate a region of the borehole wall and reduce the energy required to initiate a formation fracture. Other tools and sensors can also be included in the bottomhole assembly to gather measurements of various drilling parameters such as BHA position, orientation, weight-on-bit, borehole diameter, etc. Control/telemetry module 26 collects data from the various bottomhole assembly instruments (including position and orientation information) and stores them in internal memory. Selected portions of the data can be communicated to surface receivers 28 by, e.g., mud pulse telemetry. Other logging-while drilling telemetry methods also exist and could be employed. For example, electromagnetic telemetry or through-wall acoustic telemetry can be employed with an optional repeater 30 to extend the telemetry range. Most telemetry systems also enable commands to be communicated from the surface to the control and telemetry module to configure the operation of the tools.

Sensor data is communicated to a computer system 50 or some other form of a data processing device. Computer 50 operates in accordance with software (which may be stored on information storage media 52) and user input received via an input device 54 to process and decode the received signals. The resulting telemetry data may be further analyzed and processed by computer 50 to generate a display of useful information on a computer monitor 56 or some other form of a display device. For example, a driller could employ this system to measure fracturing-related properties of selected formations.

At various times during the drilling process, the drill string 8 may be removed from the borehole as shown in FIG. 1B. Once the drill string has been removed, logging operations can be conducted to collect data from a formation 19 using a wireline logging tool 34, i.e., a sensing instrument suspended by a cable 42 having conductors for transporting power to the tool and telemetry from the tool to the surface. The wireline logging tool 34 may have pads and/or centralizing springs to maintain the tool near the axis of the borehole as the tool is pulled uphole. Tool 34 can include an NMR instrument that collects relaxation time distribution measurements and may further include a probe with an extendible isolation pad 38. A logging facility 44 collects measurements from the logging tool 34, and includes a computer system 45 for processing and storing the measurements gathered by the logging tool. Tubing-conveyed logging is similar to wireline logging, except that a tubing string is used to move the NMR instrument through the borehole.

It should be noted that while FIGS. 1A-1B generally depict land-based operations, those skilled in the art would readily recognize that the principles described herein are equally applicable to operations that employ floating or sea-based platforms and rigs, without departing from the scope of the disclosure. Also, even though FIGS. 1A-1B depict a vertically curved wellbore, the present disclosure is equally well-suited for use in wellbores having other orientations including vertical wellbores, horizontal wellbores, slanted wellbores, multilateral wellbores or the like.

NMR tool 24 preferably has a rugged outer housing, and internally includes a circuit board and at least one capacitor. The capacitor is typically a ceramic capacitor, but this need not be the case, and there may be a mixture of ceramic capacitors and non-ceramic capacitors, or no ceramic capacitors at all. For sake of brevity the discussion herein is to ceramic capacitors, although it is to be understood that the invention is not so limited.

Figure 2:
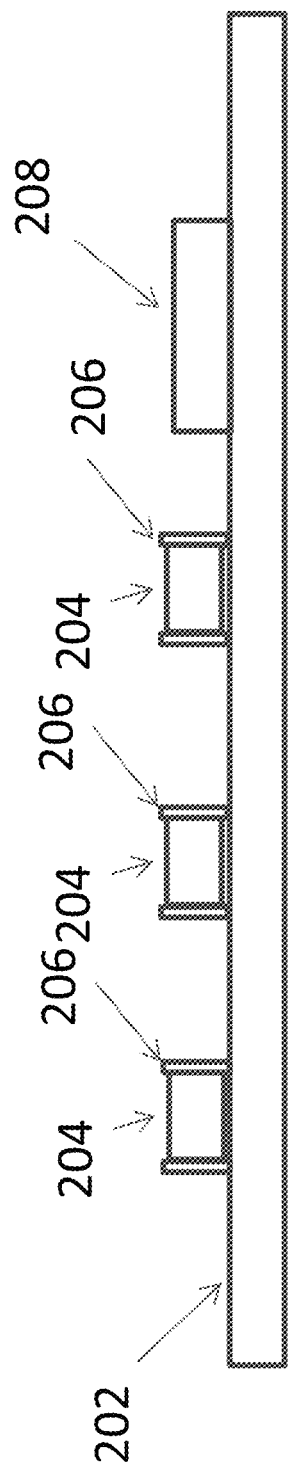
FIG. 2 illustrates an internal circuit of an NMR tool.

Referring now to FIG. 2, a representation of NMR tool 24 is shown with a rigid circuit board 202 and ceramic capacitors 204 with leads 206. Other circuit elements that may also include parasitic circuit elements on circuit board 202 are shown generically at 208. Various circuit pathways on circuit board 202 interconnect ceramic capacitors 204 and circuit elements 208 as known in the art, and not discussed further herein. Circuit elements 208 may include a controller programmed to operate NMR tool 24 according to external commands and/or stored commands, including controlling the application of voltage pulses to capacitors 204.

Figure 3:
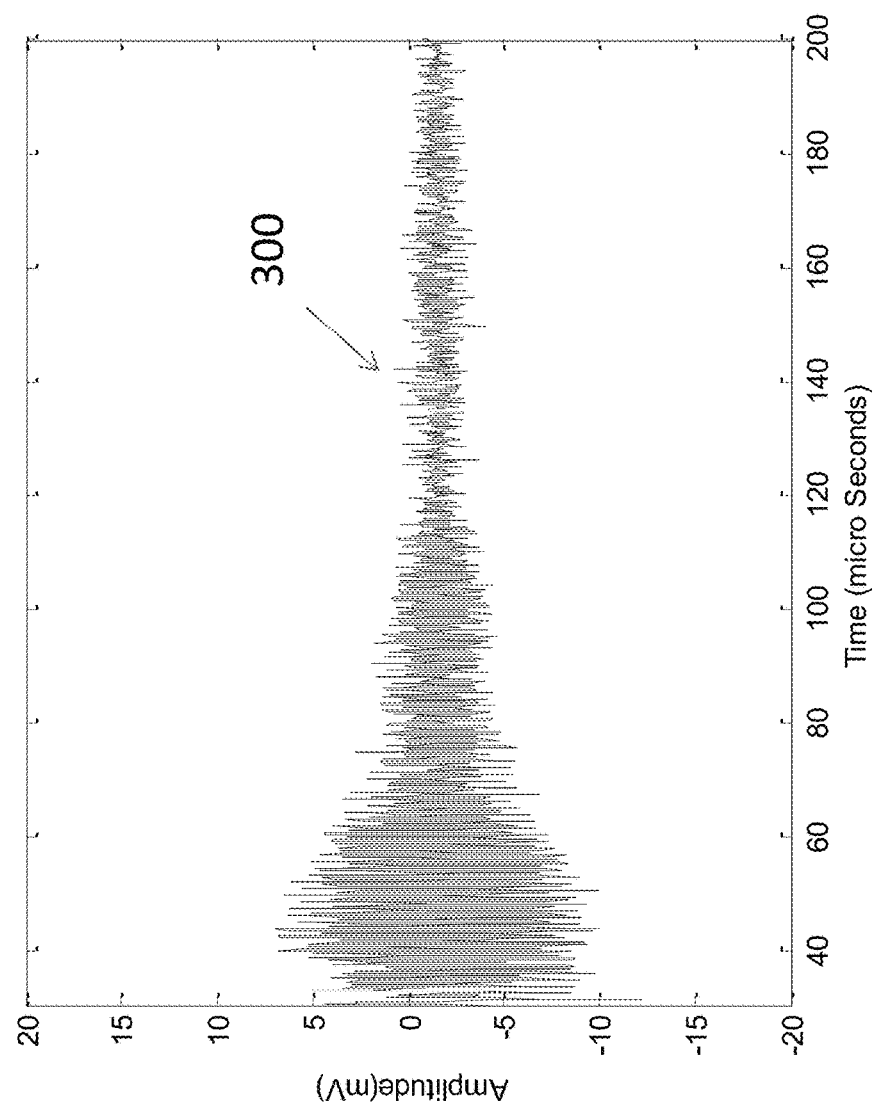
FIG. 3 illustrates a graph of the ringing produced by the embodiment of FIG. 2.

As is known in the art in response to application of voltage to a dielectric material (e.g. a ceramic capacitor 204) an electric field will be created, and the electric field causes a slight change in its shape. Removal of the voltage (e.g., at the end of a pulse) eliminates the electric field and the capacitor will return to its original shape, but it would bounce before settling down. This bouncing manifests as a physical vibration that eventually damps to within noise levels. By way of example, FIG. 3 shows a graph 300 of displacement of ringing in capacitor 204 over time, as detected by a low noise amplifier. In the particular example, the capacitor 204 is a 15 nF capacitor of 0.6×0.6×0.08 in$^3$, and the applied pulse is 1500V at 833 kHz. As seen in FIG. 3, the amplitude of the ringing is some 10× multiplier greater than underlying noise signal, and takes about 200 μs to damp out on its own (to a level that falls within the noise signal).

Figure 4:
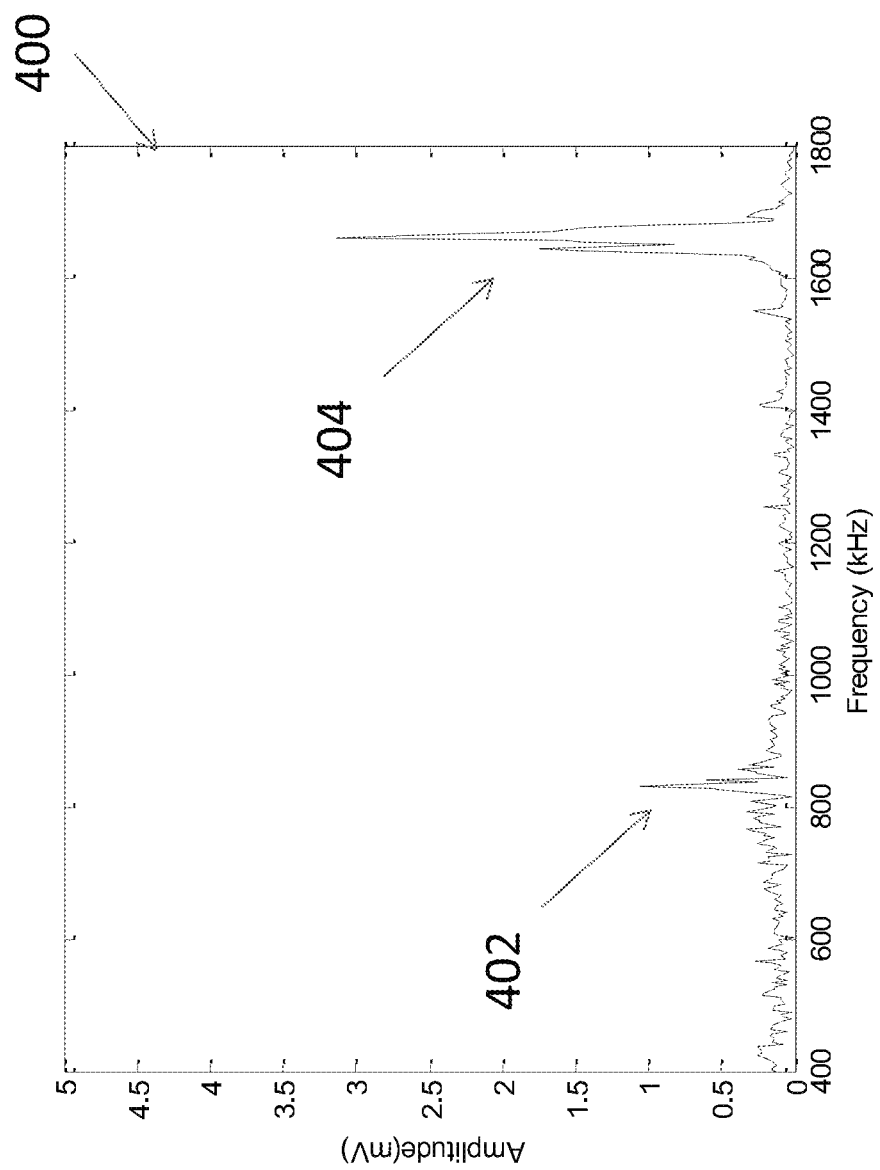
FIG. 4 illustrates a graph of the ringing produced by the embodiment of FIG. 2.

FIG. 4 shows a similar graph 400 of frequency v. displacement from ceramic capacitor 204. In the particular example, the capacitor and amount of applied voltage is the same as discussed with respect to FIG. 3. Graph 400 shows a significant vibration close to the first harmonic of the RF excitation frequency, denoted as 402, which is due to the piezoelectric effects of the dielectric material of the ceramic capacitor 204. Graph 400 also shows extreme vibration close to the second harmonic of the RF excitation frequency, denoted as 404, which is due to the electrostrictive effects of the dielectric material of the ceramic capacitor 204. Graph 400 is to be considered representative, and similar data is expected for pulses at other excitation frequencies.

Figure 5:
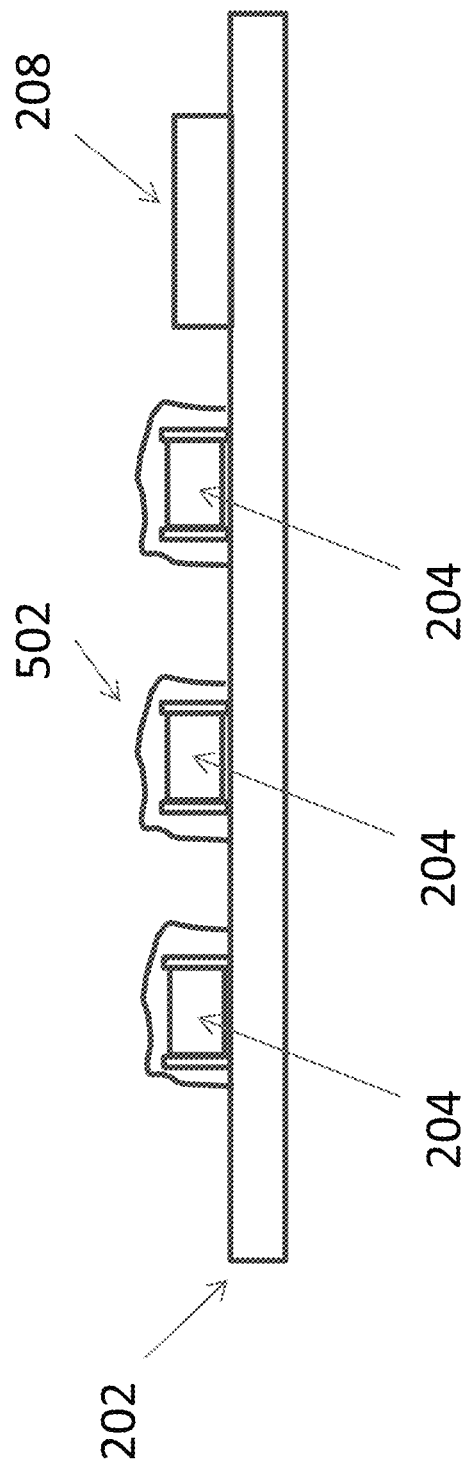
FIG. 5 illustrates an internal circuit of an NMR tool according to an embodiment of the present disclosure.

Referring now to FIG. 5, an embodiment of the present disclosure is shown. The ceramic capacitors 204 and leads 206 of circuit board 202 are substantially entirely coated with an acoustic damping material 502. The acoustic damping material 502 substantially reduces ringing, particularly at the second harmonic of the RF excitation frequency (e.g., 404 in FIG. 4).

Figure 6:
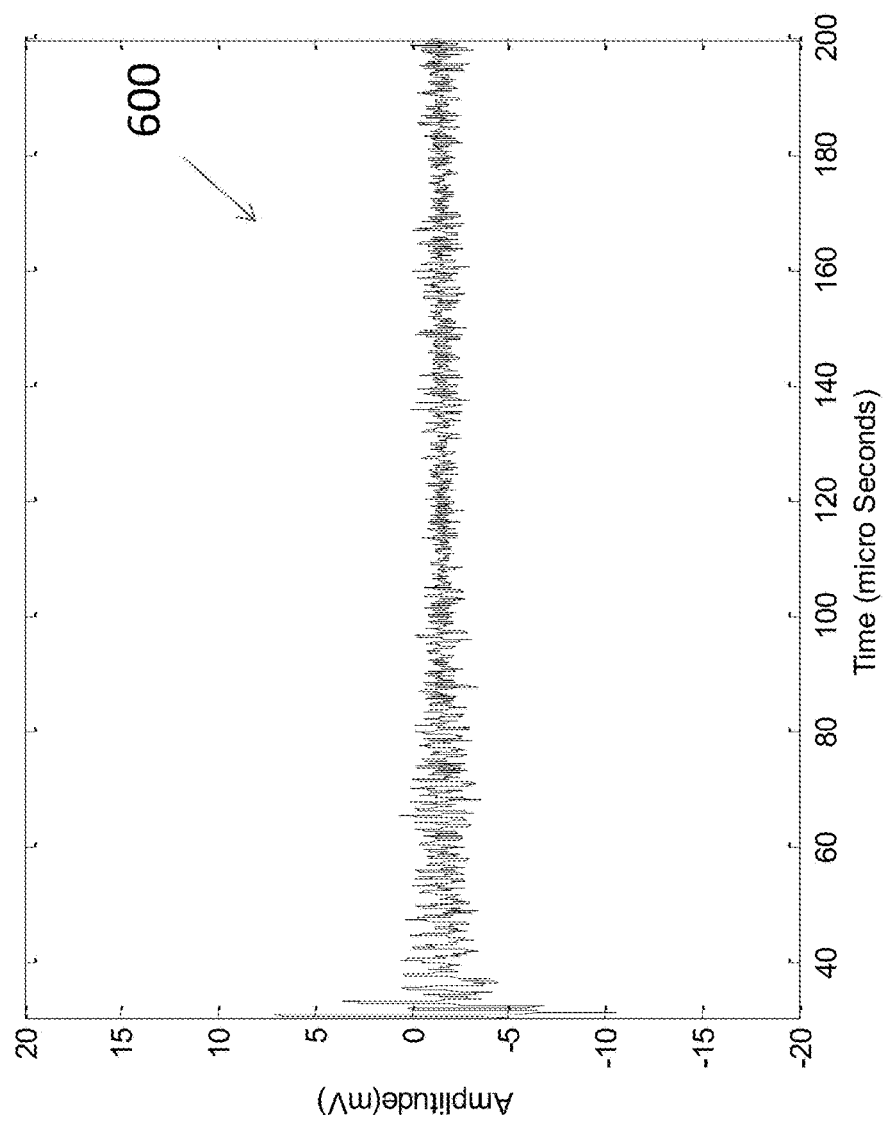
FIG. 6 illustrates a graph of the ringing produced by the embodiment of FIG. 5.

Specifically, FIG. 6 shows a graph 600 of ringing for the embodiment of FIG. 5 in the same manner and under the same conditions as graph 300 shows ringing for the embodiment of FIG. 2; the difference between FIGS. 3 and 6 are thus that FIG. 6 is with material 502 applied and FIG. 3 is without the material 502 applied. In graph 600 the amplitude of the ringing is on the order of 1.5-2× the amplitude of the noise signal (compared with 10× in graph 300), and damps to within the noise signal closer to 80-100 μs (compared to about 200 μs in graph 300). Thus the embodiment of FIG. 5 with damping material 502 has a smaller ring down time, which allows for a smaller inter-echo time.

Figure 7:
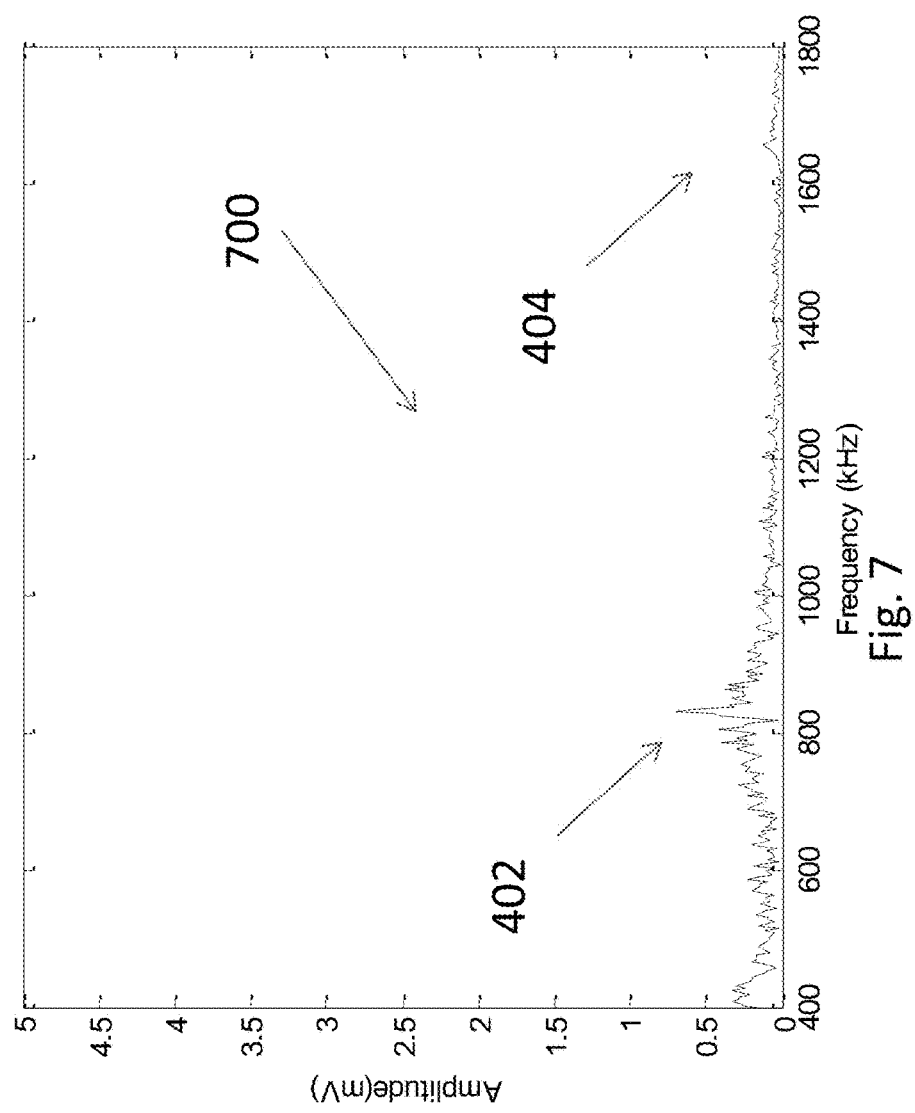
FIG. 7 illustrates a graph of the ringing produced by the embodiment of FIG. 5.

FIG. 7 shows a graph 700 of ringing for the embodiment of FIG. 5 in the same manner and under the same conditions as graph 400 of ringing for the embodiment of FIG. 2; the difference between FIGS. 4 and 7 is thus that graph 700 is with material 502 applied and graph 400 is without the material 502 applied. Comparing graphs 400 and 700, the extreme vibration 404 close to the second harmonic of the RF excitation frequency found in graph 300 is almost completely attenuated by 90+%, preferably over 95%, in graph 700.

Graph 700 also shows that the material 502 attenuates the substantial vibration 402 at the first harmonic of the RF excitation frequency found in graph 300 by about 30-50%; the reduction is significant, but not as pronounced as at the second harmonic. Applicants theorize that while material 502 damps mechanical vibration of ceramic capacitor 204 at the end of the RF pulse, there is also a mechanical vibration within ceramic capacitor 204 during the application of RF pulse. This mechanical vibration exits the ceramic capacitor 204 via leads 206 into the circuit board 202, and the mechanical vibration of the circuit board 202 induces a corollary oscillating electrical signal in other circuit elements 208 and/or back into the ceramic capacitors 204 that manifests as vibration 402 at the first harmonic.

Referring now to FIGS. 8A and 8B, another embodiment of the present disclosure is shown in which capacitors 204 and circuit elements 208 are mounted on a semi-flexible circuit board 802 that includes a layer 804 that provides mechanical support for a semi-flexible circuit board 802. Layer 804 may be made from polyamide or other suitable material. The embodiment of FIG. 8A lacks material 502, and the embodiment of FIG. 8B includes material 502. The semi-flexible circuit board 802 has a limited bending radius on the order of no less than 10× the thickness of the board without causing damage to the board 802 or the pathways that the board 802 supports. By way on non-limiting example, if the board is 6 mils thick, the minimum bend radius would be greater than 6/10 of an inch. Board 802 could also be a flexible printed circuit board.

FIGS. 9A and 9B are graphs of ringing for rigid and semi-flexible circuit board in combination with material 502, respectively. FIG. 9A shows a graph 902 of ringing in an NMR based on a circuit consistent with the embodiment of FIG. 5, using a combination of 15 nF capacitors of 0.64×0.6×0.08 in$^3$, and 22 nF capacitors of 0.64×0.6×0.1 in$^3$, with an the applied pulse is 1500V at 500 kHz. The ringing in graph 902 has two significant peaks at 50 μs and 130 μs, and does not damp out to noise levels until 200 μs or later, which is significantly smaller than if material 502 had not been used. (Applicants note that although the test environment (i.e. circuit elements) of graph 902 FIG. 9A is similar to that for graph 600 of FIG. 6, the lower frequency in graph 902 leads to a higher amplitude and a longer ring down time in the ringing.)

FIG. 9B shows a graph 904 of same circuit and test conditions as FIG. 9A and graph 902, save that a semi-flexible circuit board 802 is used as shown in FIG. 8B. Graph 904 shows significant attenuation on the order of 80+% by 60 μs, and nearly full attenuation by 120 μs. This demonstrates the further improvement provided by the combination of the semi-flexible board and damping materials.

Figure 10:
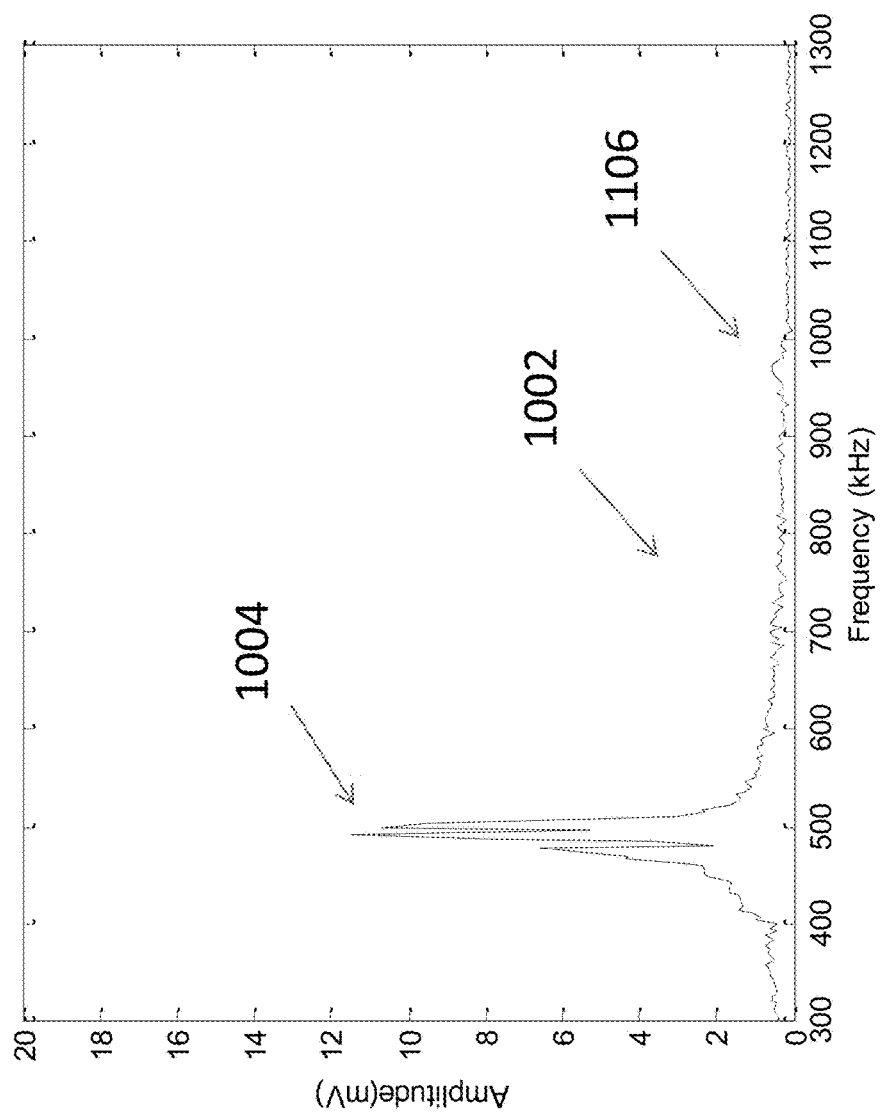
FIGS. 10-12 illustrate graphs of the ringing produced by embodiment of the present disclosure consistent with FIGS. 5, 8A and 8B, respectively.
Figure 11:
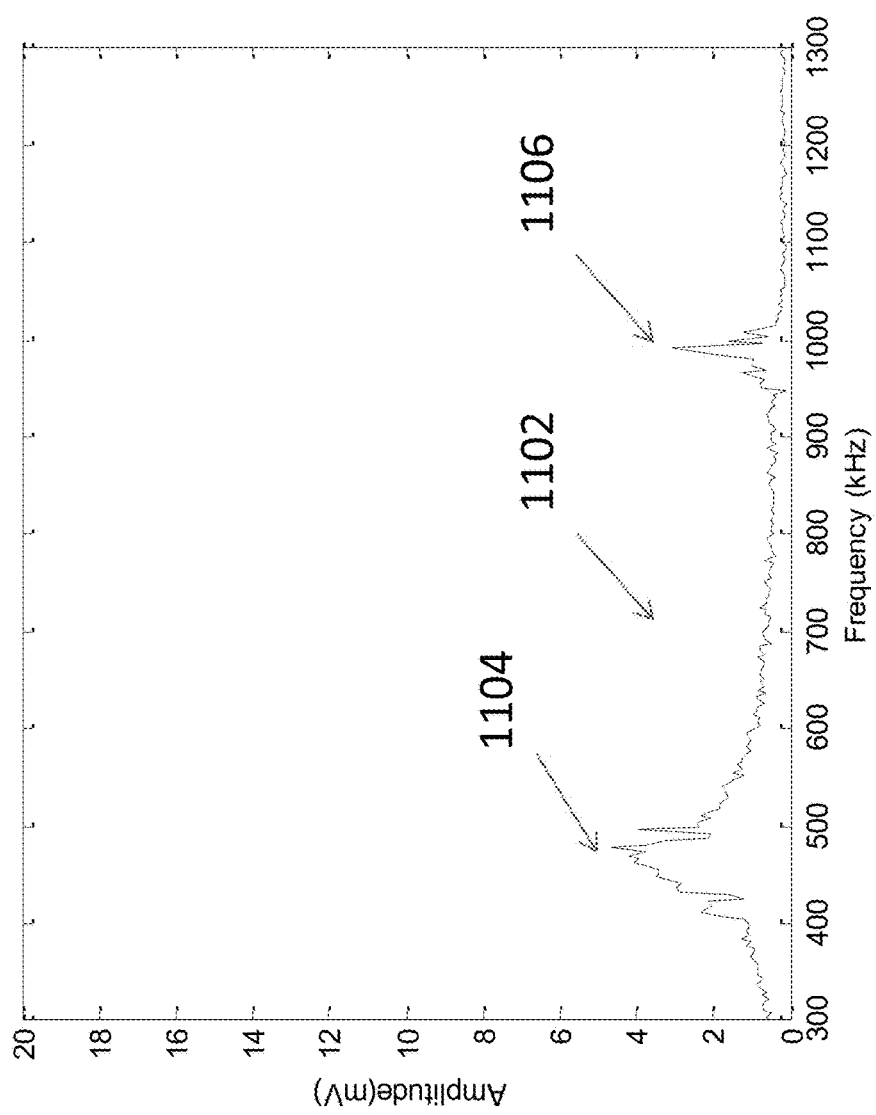
Figure 12:
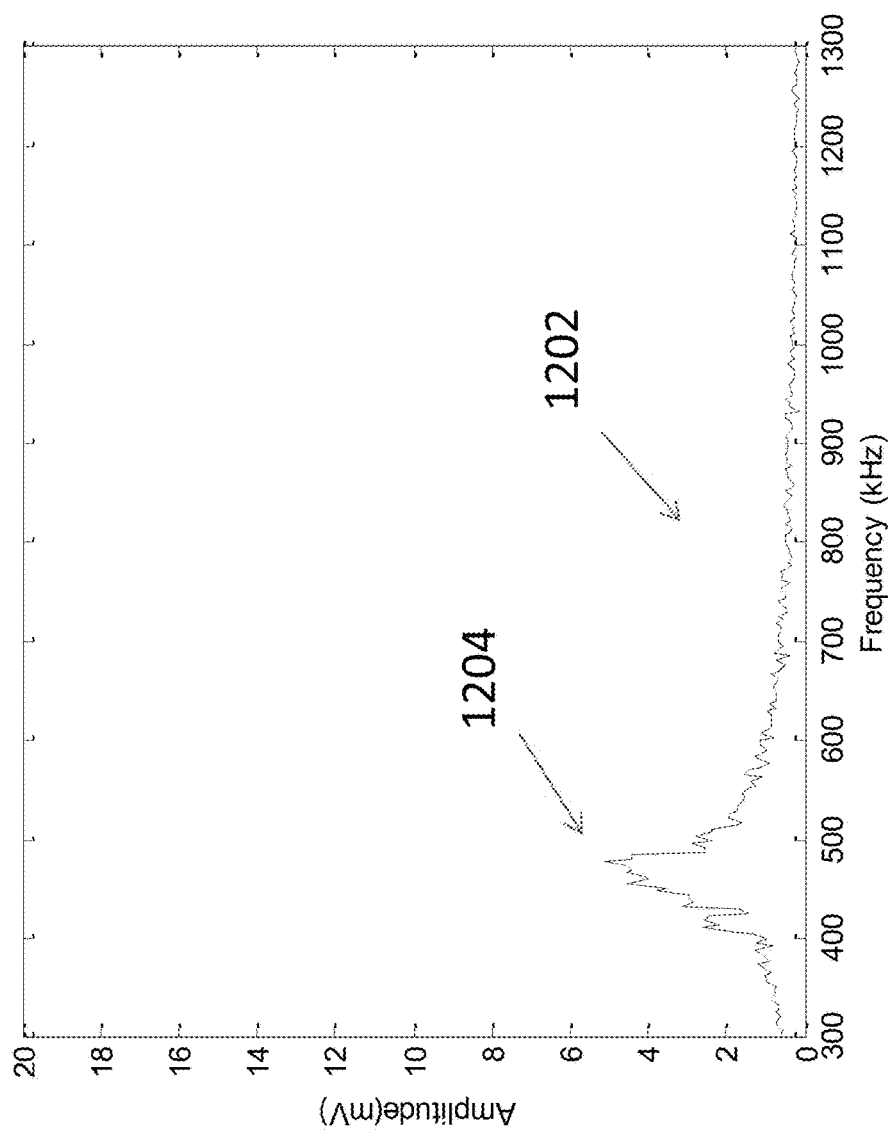

FIGS. 10-12 show graphs 1002, 1102 and 1202 of frequency v. displacement for the circuitry used in connection with FIGS. 9A and 9B. Graph 1002 thus corresponds to the graph 902 for material 502 on a rigid circuit board 202 (e.g., FIG. 5), for which (similar to graph 600) there is a peak 1004 at the first harmonic, with a minimal peak 1006 at the second harmonic (i.e., the material 502 partially reduced the peak at the first harmonic and significantly reduced the peak at the second harmonic). Graph 1102 represents the same circuits under the same test conditions but with a semi-flexible circuit board 802 and lacking material 502, and shows how the semi-flexible board 802 has a smaller peak 1104 at the first harmonic and another peak 1106 at the second harmonic. A comparison of graphs 1002 and 1102 shows that the semi-flexible printed circuit board 802 has a greater damping effect at the first harmonic as compared to the material 502, but less of a damping effect at the second harmonic. As an alternative, a flexible printed circuit board would produce comparable results.

Graph 1202 represents the same circuit under the same test conditions but with a semi-flexible circuit board 802 and capacitors 204 coated with damping material 502. The combination experiences the greatest reduction at the first peak 1204 at the first harmonic provided by the semi-flexible printed circuit board 802, and no detectable peak at the second harmonic provided by the damping material 502.

The combination of semi-flexible board 802 and damping material 502 overall damps ringing by a factor of 2.5~8 depending on the operating frequency of RF pulse, consistent with a reduction in the time constant of the damping by a factor 2~10. With that degree of damping, to the "recovery time," i.e., the time between the end of a pulse and the start of an echo can be brought below 200 μs, preferably below 100 μs, even more preferably below 50 μs, and particularly about 40 μs. This in turn allows pulses from the NMR to be separated by less than 600 μs, preferably below 300 μs, preferably below even 200 μs, and particularly about 180 μs, which is substantially smaller than the prior art.

Material 502 is preferably thermally conductive to avoid retention of heat, has an acoustic impedance similar to (e.g., 2-5×) of the ceramic capacitors 204, and spreadable for application to ceramic capacitors 204. CHOMERICS brand Thermally Conductive RTV is suitable for this purpose, although the present disclosure is not limited to this brand of RTV silicone, or RTV silicon at all.

STATEMENTS OF THE DISCLOSURE INCLUDE

Statement 1: A nuclear magnetic resonance (NMR) logging tool, comprising: a flexible or semi-flexible circuit board; at least one capacitor mounted on the board; and a controller programmed to apply sequential pulses to the at least one capacitor of the tool with a spacing of less than 600 μs between adjacent pulses. The ring down time induced by the at least one capacitor in response to pulses is less than about 200 μs.

Statement 2: The tool according to Statement 1, wherein the at least one capacitor is ceramic, and an acoustic damping material is substantially coating an exposed surface of the at least one capacitor.

Statement 3: The tool according to Statements 1 or 2, wherein the acoustic damping material is room temperature vulcanization (RTV) silicon.

Statement 4: The tool according to any of the preceding Statements 1-3, wherein the acoustic damping material has an acoustic impedance within 0.3 to 3 times that of the at least one capacitor.

Statement 5: The tool according to any of the preceding Statements 1-6, wherein the acoustic damping material is a material that can be spread on the at least one capacitor.

Statement 6: The tool according to any of the preceding Statements 1-5, wherein the controller is configured to apply sequential pulses to the capacitors of the NMR tool with a spacing of less than 300 μs between adjacent pulses.

Statement 7: The tool according to any of the preceding Statements 1-6, wherein the controller is configured to apply sequential pulses to the capacitors of the NMR tool with a spacing of less than 200 µs between adjacent pulses.

Statement 8: The tool according to any of the preceding Statements 1-7, wherein the board is semi-flexible circuit board that has a limited bending radius of no less than about 10× the thickness of the board.

Statement 9: A system, comprising: a nuclear magnetic resonance (NMR) device disposed in a wellbore, the NMR device comprising: a flexible or semi-flexible circuit board; at least one capacitor mounted on the board; and a controller programmed to apply sequential pulses to the at least one capacitor of the tool with a spacing of less than 600 µs between adjacent pulses; wherein ring down time induced by the at least one capacitor in response to pulses is less than about 200 µs.

Statement 10: The system according to any of the preceding Statements 1-9, wherein the controller is programmed to apply sequential pulses to the at least one capacitor with a spacing of less than 300 µs between adjacent pulses.

Statement 11: The system according to any of the preceding Statements 1-11, wherein an acoustic damping material is substantially coating an exposed surface of the at least one capacitor.

Statement 12: The system according to any of the preceding Statements 1-11, wherein the acoustic damping material is room temperature vulcanization (RTV) silicon.

Statement 13: The system according to any of the preceding Statements 1-12, wherein the acoustic damping material has an acoustic impedance within 0.3 to 3 times that of the at least one capacitor.

Statement 14: The system according to any of the preceding Statements 1-13, wherein the acoustic damping material is a material that can be spread on the at least one capacitor.

Statement 15: The system according to any of the preceding Statements 1-14, wherein the NMR device is suspended by a wireline in the borehole.

Statement 16: The system according to any of the preceding Statements 1-15, wherein the NMR device is incorporated into a drill string.

Statement 17: The system according to any of the preceding Statements 1-16, wherein the ring down time induced by the capacitors is less than about 80 µs.

Statement 18: The system according to any of the preceding Statements 1-17, wherein the circuit board is semi-flexible circuit board and has a limited bending radius of no less than about 10× the thickness of the semi-flexible circuit board.

Statement 19: A testing method, comprising: providing a nuclear magnetic resonance (NMR) device, the device include a semi-flexible circuit board, at least one ceramic capacitor mounted on the semi-flexible circuit board, and a controller; deploying the NMR device down a borehole to a sensing zone; collecting NMR measurements from the sensing zone; the collecting comprising applying by the controller sequential pulses to the at least one ceramic capacitor of the NMR device with a spacing of less than 600 µs between adjacent pulses; wherein ring down time induced by the at least capacitor in response to the applying is less than about 200 µs.

Statement 20: The system according to any of the preceding Statements 1-19 wherein the controller is programmed to apply sequential pulses to the at least one ceramic capacitor with a spacing of less than 300 µs between adjacent pulses.

Statement 21: The system according to any of the preceding Statements 1-20, wherein an acoustic damping material is substantially coating an exposed surface of the at least one ceramic capacitor.

The specification and drawings are, accordingly, to be regarded in an illustrative rather than a restrictive sense. It will, however, be evident that various modifications and changes may be made thereunto without departing from the broader spirit and scope of the present disclosure as set forth in the claims.

What is claimed is:

1. A nuclear magnetic resonance (NMR) logging tool, comprising:
   a flexible circuit board that has a bending radius of about 10× or less than 10× the thickness of the board or a semi-flexible circuit board that has a flexibility greater than a rigid circuit board for which virtually any bend will damage the rigid circuit board, and the semi-flexible circuit board has a bending radius that is no less than about 10× the thickness of the board;
   at least one capacitor mounted on the board, wherein the at least one capacitor induces a ringing; and
   a controller programmed to apply sequential pulses to the at least one capacitor of the tool with a spacing of less than 600 µs between adjacent pulses;
   wherein the board attenuates the ringing such that the ring down time is decreased,
   wherein ring down time of the ringing induced by the at least one capacitor in response to pulses is less than about 200 µs.

2. The tool of claim 1, wherein the at least one capacitor is ceramic, and an acoustic damping material is substantially coating an exposed surface of the at least one capacitor, wherein the acoustic damping material attenuates the ringing such that the ring down time is decreased.

3. The tool of claim 2, wherein the acoustic damping material is room temperature vulcanization (RTV) silicon.

4. The tool of claim 2, wherein the acoustic damping material has an acoustic impedance within 0.3 to 3 times that of the at least one capacitor.

5. The tool of claim 2, wherein the acoustic damping material is a material that can be spread on the at least one capacitor.

6. The tool of claim 1, wherein the controller is configured to apply sequential pulses to the capacitors of the NMR tool with a spacing of less than 300 µs between adjacent pulses.

7. The tool of claim 1, wherein the controller is configured to apply sequential pulses to the capacitors of the NMR tool with a spacing of less than 200 µs between adjacent pulses.

8. The tool of claim 1, wherein the flexible or semi-flexible circuit board has a non-negligible flexibility.

9. The tool of claim 1, wherein the board is a semi-flexible circuit board that has a flexibility greater than a rigid circuit board and less than a flexible circuit board.

10. A system, comprising:
    a nuclear magnetic resonance (NMR) device disposed in a wellbore, the NMR device comprising:
      a flexible circuit board that has a bending radius of about 10× or less than 10× the thickness of the board or a semi-flexible circuit board that has a flexibility greater than a rigid circuit board for which virtually any bend will damage the rigid circuit board, and the semi-flexible circuit board has a bending radius that is no less than about 10× the thickness of the board;
      at least one capacitor mounted on the board, wherein the at least one capacitor induces a ringing;

a controller programmed to apply sequential pulses to the at least one capacitor of the tool with a spacing of less than 600 μs between adjacent pulses;

wherein the board attenuates the ringing such that the ring down time is decreased, wherein ring down time of the ringing induced by the at least one capacitor in response to pulses is less than about 200 μs.

11. The system of claim 10, wherein the controller is programmed to apply sequential pulses to the at least one capacitor with a spacing of less than 300 μs between adjacent pulses.

12. The system of claim 10, wherein an acoustic damping material is substantially coating an exposed surface of the at least one capacitor, wherein the acoustic damping material attenuates the ringing such that the ring down time is decreased.

13. The system of claim 12, wherein the acoustic damping material is room temperature vulcanization (RTV) silicon.

14. The system of claim 12, wherein the acoustic damping material has an acoustic impedance within 0.3 to 3 times that of the at least one capacitor.

15. The system of claim 12, wherein the acoustic damping material is a material that can be spread on the at least one capacitor.

16. The system of claim 15, wherein the ring down time induced by the capacitors is less than about 80 μs.

17. The system of claim 10, wherein the NMR device is suspended by a wireline in the borehole.

18. The system of claim 10, wherein the NMR device is incorporated into a drill string.

19. The system of claim 10, wherein the flexible or semi-flexible circuit board is bendable without damage.

20. The system of claim 10, wherein the flexible or semi-flexible circuit board has a non-negligible flexibility.

21. The system of claim 10, wherein the board is a semi-flexible circuit board that has a flexibility greater than a rigid circuit board and less than a flexible circuit board.

22. The system of claim 10, wherein the flexible or semi-flexible circuit board is bendable without damage.

23. A testing method, comprising:
providing a nuclear magnetic resonance (NMR) device, the device include a semi-flexible circuit board that has a flexibility greater than a rigid circuit board for which virtually any bend will damage the rigid circuit board, and the semi-flexible circuit board has a bending radius that is no less than about 10× the thickness of the board, at least one ceramic capacitor mounted on the semi-flexible circuit board, and a controller;

deploying the NMR device down a borehole to a sensing zone;

collecting NMR measurements from the sensing zone;

the collecting comprising applying by the controller sequential pulses to the at least one ceramic capacitor of the NMR device with a spacing of less than 600 μs between adjacent pulses, wherein the ceramic capacitor induces a ringing;

wherein the semi-flexible circuit board attenuates the ringing such that the ring down time is decreased, wherein ring down time of the ringing induced by the at least capacitor in response to the applying is less than about 200 μs.

24. The method of claim 23, wherein the controller is programmed to apply sequential pulses to the at least one ceramic capacitor with a spacing of less than 300 μs between adjacent pulses.

25. The method of claim 23, wherein an acoustic damping material is substantially coating an exposed surface of the at least one ceramic capacitor, wherein the acoustic damping material attenuates the ringing such that the ring down time is decreased.

* * * * *